US009972798B2

(12) United States Patent
Ghosh et al.

(10) Patent No.: US 9,972,798 B2
(45) Date of Patent: May 15, 2018

(54) COMPOSITE DIODE, ELECTRONIC DEVICE, AND METHODS OF MAKING THE SAME

(75) Inventors: Dipankar Ghosh, Oakdale, MN (US); Ge Jiang, Austin, TX (US); Rui Yang, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 379 days.

(21) Appl. No.: 13/883,313

(22) PCT Filed: Dec. 5, 2011

(86) PCT No.: PCT/US2011/063230
§ 371 (c)(1),
(2), (4) Date: May 3, 2013

(87) PCT Pub. No.: WO2012/078488
PCT Pub. Date: Jun. 14, 2012

(65) Prior Publication Data
US 2013/0240860 A1    Sep. 19, 2013

Related U.S. Application Data

(60) Provisional application No. 61/420,105, filed on Dec. 6, 2010.

(51) Int. Cl.
*H01L 51/05* (2006.01)
*H05K 1/18* (2006.01)
(Continued)

(52) U.S. Cl.
CPC ......... *H01L 51/0587* (2013.01); *H05K 1/185* (2013.01); *H01L 27/2409* (2013.01);
(Continued)

(58) Field of Classification Search
CPC .... H01L 45/04; H01L 27/2463; H01L 45/145
(Continued)

(56) References Cited

U.S. PATENT DOCUMENTS 2,555,959 A * 6/1951 Curtis ................. C04B 35/4682
331/36 R
2,591,792 A * 4/1952 Donley .................... H03L 1/00
331/170
(Continued)

FOREIGN PATENT DOCUMENTS

EP    1 648 208 A1    4/2006
EP    1 790 684 A1    5/2007
(Continued)

OTHER PUBLICATIONS

"Embedded Capacitor Material, *Design and Processing Guidelines for Printed Circuit Board Fabricators*", dated Mar. 2004, 10 pages.
(Continued)

*Primary Examiner* — Hrayr A Sayadian
(74) *Attorney, Agent, or Firm* — Bradford B. Wright

(57) ABSTRACT

A composite diode (100) includes a first conductive sheet, (110) a second conductive sheet, (120) and a nonlinear polymer composite material (130) sandwiched therebetween. The nonlinear polymer composite material comprises nonlinear inorganic particles (150) retained in a polymeric binder material (140). Methods of making the composite diode, and electronic devices including them, are also disclosed.

9 Claims, 2 Drawing Sheets

(51) Int. Cl.
  *H01L 27/24* (2006.01)
  *H05K 1/16* (2006.01)
(52) U.S. Cl.
  CPC ............ *H01L 51/0575* (2013.01); *H05K 1/16* (2013.01); *H05K 2201/10174* (2013.01)
(58) Field of Classification Search
  USPC ............................................. 257/2, E45.002
  See application file for complete search history.

(56) References Cited

U.S. PATENT DOCUMENTS

| | | | | |
|---|---|---|---|---|
| 2,875,380 | A | * | 2/1959 | Toulon .................. H05B 33/00 250/363.01 |
| 2,944,183 | A | * | 7/1960 | Drexler .................. H01J 25/24 315/39 |
| 3,065,402 | A | * | 11/1962 | Landauer .......... G05D 23/2036 323/293 |
| 4,234,439 | A | | 11/1980 | Kehr et al. |
| 4,888,630 | A | * | 12/1989 | Paterson ........... H01L 27/11502 257/295 |
| 6,124,549 | A | | 9/2000 | Kemp et al. |
| 6,274,224 | B1 | | 8/2001 | O'Bryan et al. |
| 6,638,378 | B2 | | 10/2003 | O'Bryan et al. |
| 8,435,427 | B2 | | 5/2013 | Ghosh et al. |
| 2003/0116348 | A1 | | 6/2003 | Nakatani et al. |
| 2004/0023416 | A1 | * | 2/2004 | Gilbert ................ C23C 16/0272 438/3 |
| 2004/0232919 | A1 | * | 11/2004 | Lacey .................... G01R 31/11 324/533 |
| 2006/0133011 | A1 | * | 6/2006 | Cox .......................... B32B 7/02 361/311 |
| 2006/0138591 | A1 | | 6/2006 | Amey |
| 2006/0203534 | A1 | * | 9/2006 | Kalkur .................. H03M 1/804 365/145 |
| 2007/0006435 | A1 | | 1/2007 | Banerji et al. |
| 2007/0117898 | A1 | * | 5/2007 | Tan ........................ H01B 3/006 524/413 |
| 2008/0154320 | A1 | * | 6/2008 | Sherwood .............. A61N 1/375 607/9 |
| 2010/0047535 | A1 | | 2/2010 | Kosowsky et al. |
| 2010/0270549 | A1 | | 10/2010 | Frye et al. |
| 2012/0049135 | A1 | * | 3/2012 | Ghosh ...................... H01B 1/22 252/519.21 |
| 2017/0022608 | A1 | * | 1/2017 | King ......................... B22F 1/02 |

FOREIGN PATENT DOCUMENTS

| | | |
|---|---|---|
| JP | 05-335116 A | 12/1993 |
| JP | 2006-196886 A | 7/1995 |
| JP | 07-272908 A | 10/1995 |
| WO | WO 02/45183 A2 | 6/2002 |
| WO | WO 2005/086978 A2 | 9/2005 |
| WO | WO 2010/021998 | 2/2010 |

OTHER PUBLICATIONS

Thomas, P., et al., "Dielectric properties of Poly(vinylidene fluoride)/$CaCu_3Cu_4O_{12}$ composites", Composites Science and Technology, Dec. 24, 2009, pp. 539-545.
Tuncer, Enis, et al., "Electrical properties of epoxy resin based nano-composites", IOPscience, Oct. 25, 2010, 7pages.
Chung, Sung-Yoon, et al., "Strong nonlinear current-voltage behavior in perovskite-derivative calcium copper titanate", Nature Materials, vol. 3, Nov. 2004, pp. 774-778.
Bueno, Paulo R., et al., "$SnO_2$, ZnO and related polycrystalline compound semiconductors: An overview and review on the voltage-dependent resistance (non-ohmic) feature", Journal of the European Ceramic Society 28, Aug. 15, 2007, pp. 505-529.
PCT International Search Report, PCT/US2011/063230, dated Apr. 24, 2012, 5 pages.
E. Mårtensson et al., "Alternate current characteristics of SiC powders", Journal of Applied Physics, 2001, vol. 90, pp. 2870-2878.
W. A. Hussain et al., Dielectric Properties and a.c. Conductivity of Epoxy Alumina. Silicate NGK Composites, Advances in Chemical Engineering and Science, 2015, vol. 5, pp. 282-289.
J. W. Liou et al., "Dielectric tunability of barium strontium titanate/silicone-rubber composite", Journal of Physics: Condensed Matter, 1998, vol. 10, pp. 2773-2786.
R. Balachandran et. al., "Dielectric Characteristics of Barium Strontium Titanate Based Metal Insulator Metal Capacitor for Dynamic Random Access Memory Cell", International Journal of Electrochemical Science, 2012, vol. 7, pp. 11895-11903.
M. A. Subramanian et al., "$ACu_3Ti_4O_{12}$ and $ACu_3Ru_4O_{12}$ perovskites: high dielectric constants and valence degeneracy", Solid State Sciences, 2002, vol. 4, pp. 347-351.

* cited by examiner

COMPOSITE DIODE, ELECTRONIC DEVICE, AND METHODS OF MAKING THE SAME

TECHNICAL FIELD

The present disclosure broadly relates to diodes and electronic devices containing them.

BACKGROUND

Printed circuit boards (PCBs), upon which a large number of discrete components are mounted, are widely used in electronics. Conductive traces are generally disposed on and/or within the PCB. The conductive traces are typically made by patterning (typically by etching) thin copper foil. A PCB populated with electronic components is known as a printed circuit assembly (PCA). PCBs are generally double sided, with through-hole plating that electrically connect opposite sides.

PCBs are typically formed by lamination of multiple insulating, and optionally additional conductive layers. Conductive layers are typically made of thin copper foil. Insulating dielectric prepreg layers typically laminated together with epoxy resin. PCBs are often coated with a solder mask, which is often green in color. There are many different dielectrics that can be chosen to provide different insulating values depending on the requirements of the circuit design. Well-known prepreg materials used in the PCB industry include FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (woven glass and epoxy), CEM-4 (woven glass and epoxy), and CEM-5 (woven glass and polyester).

The vast majority of printed circuit boards are made by bonding a layer of copper over the entire substrate, sometimes on both sides, (creating a "blank PCB") then removing unwanted copper after applying a temporary mask (for example, by etching), leaving only the desired copper traces. A few PCBs are made by adding traces to the bare substrate (or a substrate with a very thin layer of copper) usually by a complex process of multiple electroplating steps.

In recent years, a trend toward decreasing PCB size has put a premium on space usage on PCBs. One approach has been to embed components within the body of the PCB as the part of PCBs laminated structure. For example, 3M Company markets a line of embeddable capacitors under the trade designation 3M Embedded Capacitance Material (3M ECM).

Yet, the number of components that are available in embeddable form remains small in number, and there remains a need for components that can be embedded within PCBs.

SUMMARY

In one aspect, the present disclosure provides a composite diode comprising:
 a first conductive sheet,
 a second conductive sheet,
 a layer of nonlinear polymer composite material sandwiched between the first conductive sheet and the second conductive sheet, wherein the layer of nonlinear polymer composite material is substantially coextensive with respect to length and width of the first and second conductive sheets, and wherein the nonlinear polymer composite material comprises nonlinear inorganic particles retained in a polymeric binder material.

In another aspect, the present disclosure provides an electronic device comprising a composite diode embedded in a printed circuit board, wherein the composite diode comprises a first conductive sheet,
 a second conductive sheet,
 a layer of nonlinear polymer composite material sandwiched between the first conductive sheet and the second conductive sheet, and wherein the nonlinear polymer composite material comprises nonlinear inorganic particles retained in a polymeric binder material.

In yet another aspect, the present disclosure provides a method of making a composite diode, the method comprising:
 forming a first layer of a slurry on a first conductive member, wherein the slurry comprises nonlinear inorganic particles in a hardenable binder precursor;
 forming a second layer of the slurry on a second conductive member;
 joining the first and second layer of the slurry, wherein the slurry is sandwiched between the first and second conductive members; and
 at least partially hardening the hardenable binder precursor.

Advantageously, composite diodes according to the present disclosure can replace large and heavy conventional surface mounted composite diodes by embedding them in PCBs, thereby allowing miniaturization of PCBs; for example, for use in compact electronic devices.

Composite diodes according to the present disclosure are useful in electronic devices where they may be included in, for example, surge-protection circuits. Advantageously, they can be embedded within a PCB, thereby allowing miniaturization of the circuit design.

Accordingly, in yet another aspect, the present disclosure provides an electronic device comprising a composite diode according to the present disclosure.

As used herein, the term "substantially coextensive with respect to length and width" as it refers to the layer of nonlinear polymer composite material means coextensive with respect to length and width other than minor variations that taken as a whole result in a deviation of less than five percent from the total area of the layer of nonlinear polymer composite material.

As used herein, the term "nonlinear" refers to reversible nonlinear conductivity of a material with respect to changing voltage.

As used herein, the term "sheet" refers to an article that has length and width much larger (for example, at least 10 times, at least 20 times, or even at least 50 times larger) than its thickness, and includes, for example, panels and rolls.

The features and advantages of the present disclosure will be further understood upon consideration of the detailed description as well as the appended claims.

While the above-identified drawing figures set forth several embodiments of the present disclosure, other embodiments are also contemplated, as noted in the discussion. In all cases, this disclosure presents the disclosure by way of representation and not limitation. It should be understood that numerous other modifications and embodiments can be devised by those skilled in the art, which fall within the scope and spirit of the principles of the disclosure. The figures may not be drawn to scale.

DETAILED DESCRIPTION

Figure 1:
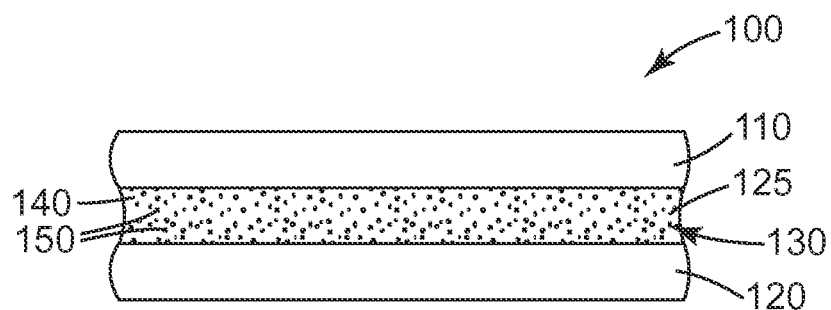
FIG. 1 is a schematic side view of an exemplary composite diode according to the present disclosure.

Referring now to FIG. 1, exemplary composite diode 100 comprises first conductive sheet 110, second conductive sheet 120, and layer 125 of nonlinear polymer composite material 130 sandwiched between first conductive 110 sheet and second conductive sheet 120. Nonlinear polymer composite material 130 comprises nonlinear inorganic particles 150 retained in a polymeric binder material 140. Layer 125 of nonlinear polymer composite material 130 is substantially coextensive with respect to length and width of the first and second conductive sheets 110, 120.

Conductive sheets 110, 120 can be made of any conductive material, typically metallic although other materials can also be used. Examples of useful conductive materials that can be formed into sheets and/or foils include copper, nickel, gold, silver, chromium, aluminum, palladium, stainless steel, and combinations thereof. In order to facilitate embedding of the composite diode into a PCB, the conductive sheets desirably are relatively thin. For example, they may have a thickness in a range of from 10 to 150 microns, more typically 10 to 80 microns, or even about 35 microns.

Useful nonlinear inorganic particles include, for example: silicon carbide, zinc oxide doped with oxides of metals such as Bi, Sb, Co, Mn, Ni, and/or Cr (for example, $Bi_2O_3$, $Cr_2O_3$, $Sb_2O_3$, $CO_2O_3$, and $MnO_3$); semiconductive and doped $SrTiO_3$ (for example, doped with $La_2O_3$ or $Al_2O_3$); doped $SnO_2$ and $TiO_2$ (for example, doped with an oxide of tantalum or niobium); and calcium copper titanate particles calcined at about 1100° C. (CCT) (for example, doped or not doped) as described in co-pending U.S. patent appliation Ser. No. 12/869129, filed Aug. 26, 2010, and entitled "COMPOSITIONS HAVING NON-LINEAR CURRENT-VOLTAGE CHARACTERISTICS", the disclosure of which is incorporated herein by reference.

The nonlinear inorganic particles should generally be chosen such that they have a size that is smaller in at least one dimension than the total thickness of the layer of nonlinear composite material. For example, the nonlinear inorganic particles may have a size that is smaller than 100 microns in at least one dimension. This includes, for example, small spherical particles (small in three dimensions) and small whiskers (small in one dimension).

The polymeric binder material may comprise elastomeric materials, for example urethane, silicone, or EPDM; thermoplastic polymers, for example polyethylene or polypropylene; adhesives such as, for example, those based on ethylene-vinyl-acetate or urethane; thermoplastic elastomers; gels; thermosetting materials such as, for example, epoxy resins; or a combination of such materials, including co-polymers such as, for example, a combination of polyisobutylene and amorphous polypropylene.

The nonlinear inorganic particles typically comprise between about 25 volume percent and about 65 volume percent (for example, about 30 to 50 volume percent) of the nonlinear polymer composite material, although other amounts may also be used.

The nonlinear polymer composite material may also comprise other well-known additives for those materials, for example, to improve their processibility and/or suitability for particular applications. Suitable additives may include processing agents, stabilizers, antioxidants, and plasticizers.

The thickness of the nonlinear polymer composite material is typically in a range of from 10 to 500 microns, more typically from 30 to 400 microns, although other thicknesses may also be used.

The total thickness of composite diodes according to the present disclosure is typically in a range for from 10 to 600 microns, although other thicknesses may be used. Composite diodes according to the present disclosure may be, for example, rigid or flexible.

Composite diodes according to the present disclosure can be made by any suitable method. One exemplary method includes forming a slurry of nonlinear inorganic particles dispersed in a hardenable (for example, curable and/or solidifiable) binder precursor and optional organic solvent. The slurry may be then coated onto a first conductive member, and then laminated to a second conductive member. Alternatively, the slurry may be separately coated onto both of the first and second conductive members and then the slurry layer joined together to form single layer sandwiched between the first and second conductive members. However fabricated, once the three-layer laminate construction (first conductive member—nonlinear polymer composite material—second conductive member) is formed the binder precursor is at least partially hardened (for example, at least partially cured); for example, by curing in the case of a thermosetting binder precursor such as an epoxy resin, or by solidifying in the case of a thermoplastic binder precursor.

Composite diodes according to the present disclosure are useful in electronic devices such as, for example, cellular phones, personal data assistants, sensors, televisions, audio equipment, radios, and computers. In such devices they may provide surge protection. In such applications, a surge protection circuit element, parallel to an active circuit element provides surge protection due to the nonlinear current-voltage response of the composite diode. For example, when an applied voltage to the circuit reaches the threshold electrical field of the nonlinear composite material, the nonlinear composite material switches from an insulating state to a conducting state. The behavior is reversible under the normal operation voltage range of the designed device.

Figure 2:
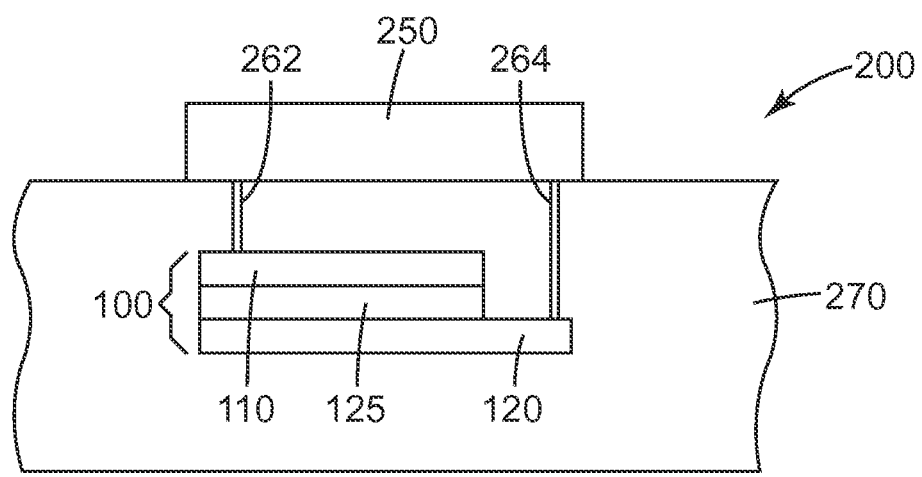
FIG. 2 is a schematic cross-sectional view of an exemplary electronic device according to the present disclosure.

One exemplary such electronic device is shown in FIG. 2. Referring now to FIG. 2, electronic device 200 comprises composite diode 100 embedded within printed circuit board 270. Semiconductor die 250 is electrically connected to first and second conductive electrodes 110, 120 via first and second conductive vias 262, 264, respectively. Nonlinear polymer composite material 130 is sandwiched between first and second conductive electrodes 110, 120. As shown in FIG. 2, the composite diode is mounted in parallel to circuitry of the semiconductor die and serves to provide surge protection.

Methods of embedding electrical elements such as capacitors in PCBs are well-known in the industry and can be readily adapted and used for embedding composite diodes according to the present disclosure.

SELECT EMBODIMENTS OF THE DISCLOSURE

In a first embodiment, the present disclosure provides a composite diode comprising:

a first conductive sheet,
a second conductive sheet,
a layer of nonlinear polymer composite material sandwiched between the first conductive sheet and the second conductive sheet, wherein the layer of nonlinear polymer composite material is substantially coextensive with respect to length and width of the first and second conductive sheets, and wherein the nonlinear polymer composite material comprises nonlinear inorganic particles retained in a polymeric binder material.

In a second embodiment, the present disclosure provides a composite diode according to the first embodiment, wherein the nonlinear polymer composite material comprises doped zinc oxide or calcined calcium copper titanate.

In a third embodiment, the present disclosure provides a composite diode according to the first or second embodiment, wherein the nonlinear polymer composite material comprises doped zinc oxide or calcined calcium copper titanate.

In a fourth embodiment, the present disclosure provides a composite diode according to any one of the first to third embodiments, wherein the first conductive sheet and the second conductive sheet comprise metal foils.

In a fifth embodiment, the present disclosure provides an electronic device comprising a composite diode according to any one of the first to fourth embodiments.

In a sixth embodiment, the present disclosure provides an electronic device comprising a composite diode embedded in a printed circuit board, wherein the composite diode comprises a first conductive sheet,
a second conductive sheet,
a layer of nonlinear polymer composite material sandwiched between the first conductive sheet and the second conductive sheet, and wherein the nonlinear polymer composite material comprises nonlinear inorganic particles retained in a polymeric binder material.

In a seventh embodiment, the present disclosure provides an electronic device according to the sixth embodiment, wherein the nonlinear polymer composite material comprises doped zinc oxide or calcined calcium copper titanate.

In an eighth embodiment, the present disclosure provides an electronic device according to the sixth or seventh embodiment, wherein the nonlinear polymer composite material comprises an at least partially cured epoxy resin.

In a ninth embodiment, the present disclosure provides an electronic device according to any one of the sixth to eighth embodiments, wherein the first conductive sheet and the second conductive sheet comprise metal foils.

In a tenth embodiment, the present disclosure provides an electronic device according to any one of the sixth to ninth embodiments, wherein the printed circuit board comprises a portion of a cellular phone, personal data assistant, sensor, or computer.

In an eleventh embodiment, the present disclosure provides a method of making a composite diode, the method comprising:
forming a first layer of a slurry on a first conductive member, wherein the slurry comprises nonlinear inorganic particles in a hardenable binder precursor;
forming a second layer of the slurry on a second conductive member;
joining the first and second layer of the slurry, wherein the slurry is sandwiched between the first and second conductive members; and
at least partially hardening the hardenable binder precursor.

In a twelfth embodiment, the present disclosure provides a method according to the eleventh embodiment, wherein the nonlinear inorganic particles comprise doped zinc oxide or calcined calcium copper titanate.

In a thirteenth embodiment, the present disclosure provides a method according to the eleventh or twelfth embodiment, wherein the hardenable binder precursor comprises an epoxy resin.

In a fourteenth embodiment, the present disclosure provides a method according to any one of the eleventh to thirteenth embodiments, wherein the first conductive sheet and the second conductive sheet comprise metal foils.

Objects and advantages of this disclosure are further illustrated by the following non-limiting examples, but the particular materials and amounts thereof recited in these examples, as well as other conditions and details, should not be construed to unduly limit this disclosure.

EXAMPLES

Unless otherwise noted, all parts, percentages, ratios, etc. in the Examples and the rest of the specification are by weight. All solvents and materials were standard reagent grade obtained from commercial sources and were used without further purification unless specified otherwise.
Materials Copper oxide (CuO, 99 percent purity) powder was obtained from Alfa Aesar, Ward Hill. MA.

CAF refers to 4,4'-(9H-fluoren-9-ylidene)bis(2-chlorobenzenamine), CAS No. 107934-68-9, also known as chloroaniline fluorenone amine curative, is available commercially, for example, from Chemos GmbH of Regenstauf Germany.

Calcium carbonate ($CaCO_3$, 99% purity) powder was obtained from Alfa Aesar. Titania ($TiO_2$, 99% purity) powder was obtained from J. T. Baker, Phillipsburg, NJ.

Copper oxide (CuO, 99 percent purity) powder was obtained from Alfa Aesar, Ward Hill. MA.

EPON RESIN 1001F low molecular weight bisphenol A-derived curable epoxy resin was obtained from Hexion Specialty Chemicals, Columbus, Ohio.

EPON HPT RESIN 1050 curable epoxy resin, a reaction product of novolac resin and epichlorohydrin, was obtained from Hexion Specialty Chemicals, Columbus, Ohio.

Doped ZnO fine powder, with particle size of about 20 microns, was obtained from ABB Switzerland Ltd., Switzerland.

Example 1

To prepare calcium copper titanate ($CaCu_3Ti_4O_{12}$, referred to hereinafter as CCT) powders, stoichiometric quantities of high purity CuO (3 molar equivalent), $CaCO_3$ (1 molar equivalent) and $TiO_2$ (4 molar equivalent) powders were wet ball milled in distilled water (150 g) in 500 mL NALGENE bottles using yttria-stabilized zirconium oxide as the grinding media (5 mm beads, available from Inframat Advanced Materials of Manchester, Conn.) with the bottles being placed in a Jar Rolling Mill (available from Paul O. Abbe Co. of Bensenville, Illinois) for 24 hours to make a slurry.

The slurry was dried in an oven at 100° C. for 3 hrs, and then calcined in a furnace at 1100° C. for 10 hours to obtain CCT powder. Both heating and cooling rate was constant at 10° C./minute. The resulting CCT powders were sieved to a particle diameter size of less than 50 microns, and then ground using a mortar and pestle to obtain the final powders.

The stoichiometry of the resulting CCT powders was confirmed by X-Ray Diffraction (XRD) method.

CCT powder, prepared as described above, was mixed with EPON 1001F and EPON 1050 epoxy solution using (EPON 1001 F:EPON 1050 in a 4:1 weight ratio, at 50 weight percent total epoxy resin in methyl ethyl ketone and methyl isobutyl ketone (1:3 weight ratio) as solvents) and CAF as curative to make a 30 volume percent CCT-epoxy resin solution. A portion of this 30 volume percent CCT-epoxy resin solution master batch was then coated on standard copper foils (thickness=35 microns, obtained from Schlenk Metallfolien GmbH of Roth, Germany) in such a manner to result in 15 to 35 microns thick coatings of CCT-epoxy resin mixture on the copper foil. A pair of the coated copper foils was laminated with the CCT-resin mixture coatings facing each other in a standard roller laminator at 150° C. The laminate was cured at 190° C. for 4 hours in an oven to get a three-layer laminate with a 35 to 70 microns thick middle layer of CCT-epoxy resin.

Figure 3:
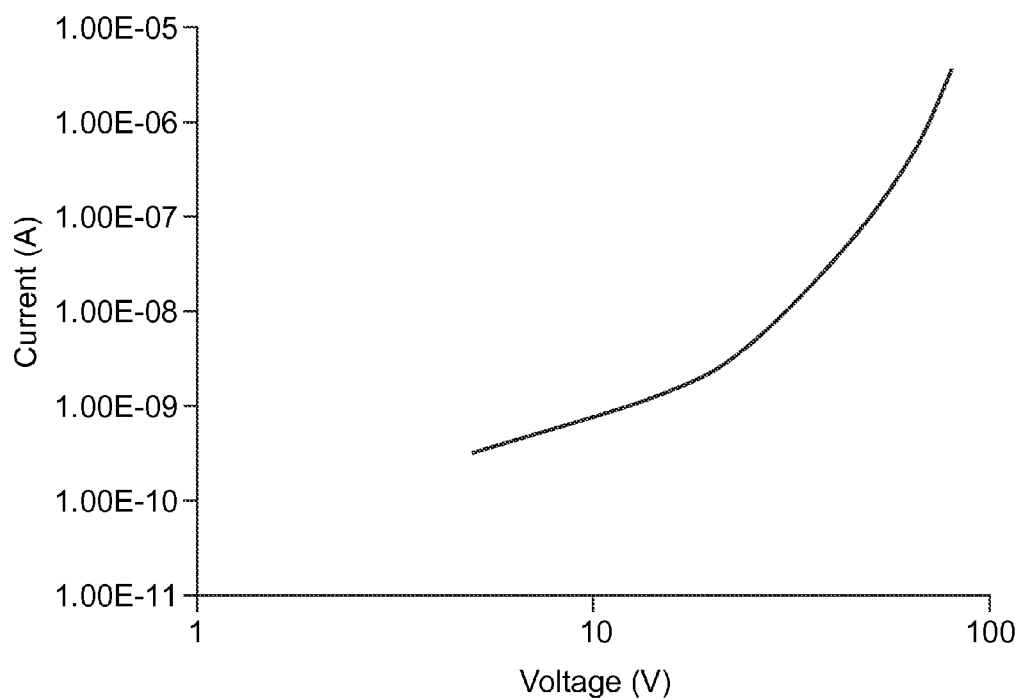
FIG. 3 is a plot showing nonlinear Current-Voltage characteristics for the composite diode of Example 1.

The resulting composite diodes, which contained 30 volume percent CCT filler-epoxy matrix composites were cut in to smaller test pieces (15 cm by 10 cm in dimensions) and their current-voltage (I-V) and conductivity characteristics were determined using a Keithley 619 programmable electrometer fitted with a Keithley 247 High Voltage Power Supply unit, all obtained from Keithley Instruments, Inc. of Cleveland, Ohio. Measurements were carried out at room temperature using a step voltage ramp, where the current was measured at the end of each voltage step, and are reported in FIG. 3. At low applied fields the composite demonstrated linear I-V characteristic (that is, current varies linearly with change in voltage). With increase in field the current changed rapidly in a nonlinear fashion resulting in current value changes by several orders of magnitude.

Example 2

Doped ZnO fine powder was mixed with EPON 1001F and EPON 1050 epoxy solution using (EPON 1001 F:EPON 1050 in a 4:1 weight ratio, at 50 weight percent total epoxy resin in methyl ethyl ketone and methyl isobutyl ketone (1:3 weight ratio) as solvents) and CAF as curative to make a 27 volume percent ZnO-epoxy resin solution. A portion of this 27 volume percent ZnO-epoxy resin solution master batch was then liquid coated on standard copper foils (thickness=35 micron, obtained from Schlenk Metallfolien GmbH of Roth, Germany), and dried in oven for 100° C. for 15 minutes. A pair of the coated copper foils was laminated with the ZnO-resin mixture coatings facing each other in a standard roller laminator at 150° C. The laminate was cured at 190° C. for 4 hours in an oven to get a three-layer laminate with a total thickness of 450 microns. The middle layer of ZnO-epoxy resin is 380 microns thick.

Figure 4:
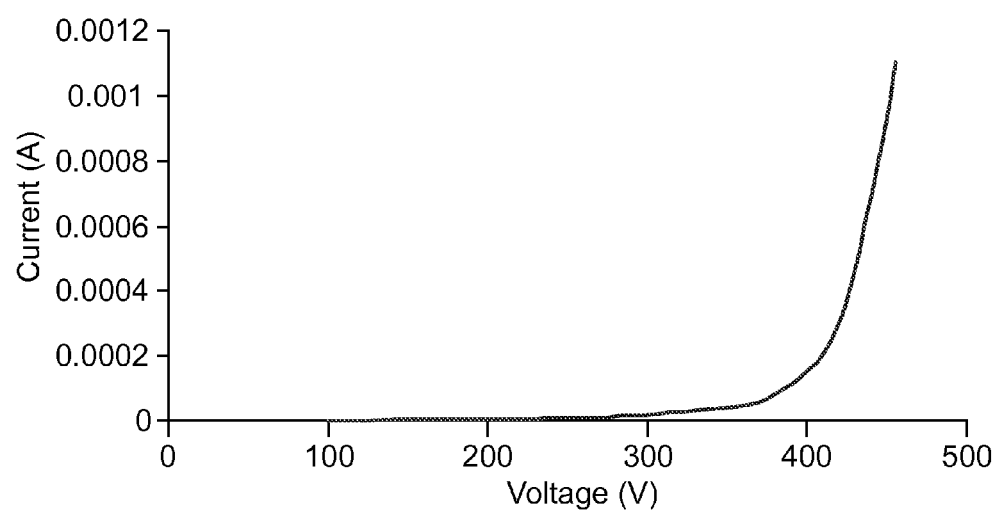
FIG. 4 is a plot showing nonlinear Current-Voltage characteristics for the composite diode of Example 2.

The resulting nonlinear diodes, which contained 27 volume percent ZnO filler-epoxy matrix composites were cut in to smaller test pieces (1.25 inch×1.25 inch (3.18 cm×3.18 cm)) and their current-voltage (I-V) and conductivity characteristics were determined using a Keithley 619 programmable electrometer fitted with a Keithley 247 High Voltage Power Supply unit, all obtained from Keithley Instruments, Inc. Measurements were done at room temperature, and are reported in FIG. 4. At low applied fields the composite demonstrates linear I-V characteristic (that is, current varies linearly with change in voltage). With increase in applied field the current changes rapidly in a nonlinear fashion.

Any examples given herein are to be considered non-limiting unless otherwise indicated. Various modifications and alterations of this disclosure may be made by those skilled in the art without departing from the scope and spirit of this disclosure, and it should be understood that this disclosure is not to be unduly limited to the illustrative embodiments set forth herein.

What is claimed is:

1. A composite diode comprising:
   a first conductive sheet,
   a second conductive sheet,
   a layer of nonlinear polymer composite material sandwiched between the first conductive sheet and the second conductive sheet, wherein the layer of nonlinear polymer composite material is substantially coextensive with respect to length and width of the first and second conductive sheets, and wherein the nonlinear polymer composite material comprises nonlinear inorganic particles retained in a polymeric binder material, wherein the nonlinear inorganic particles comprise calcined calcium copper titanate particles, wherein the calcined copper titanate particles are formed by calcining at at least about 1100° C. for at least about 10 hours, and wherein the nonlinear inorganic particles have reversible nonlinearity, of about 4 orders of magnitude in current, from about 30 volts to about 100 volts across about 50 microns of thickness of the nonlinear polymer composite material.

2. The composite diode of claim 1, wherein the nonlinear polymer composite material comprises an at least partially cured epoxy resin.

3. The composite diode of claim 1, wherein the first conductive sheet and the second conductive sheet comprise metal foils.

4. An electronic device comprising the composite diode of claim 1.

5. An electronic device comprising a composite diode and a printed circuit board, wherein the composite diode is embedded in the printed circuit board, wherein the composite diode comprises a first conductive sheet,
   a second conductive sheet,
   a layer of nonlinear polymer composite material sandwiched between the first conductive sheet and the second conductive sheet, wherein the nonlinear polymer composite material comprises nonlinear inorganic particles retained in a polymeric binder material, and wherein the nonlinear inorganic particles comprise calcined calcium copper titanate particles, wherein the calcined copper titanate particles are formed by calcining at at least about 1100° C. for at least about 10 hours, and wherein the nonlinear inorganic particles have reversible nonlinearity, of about 4 orders of magnitude in current, from about 30 volts to about 100 volts across about 50 microns of thickness of the nonlinear polymer composite material.

6. The electronic device of claim 5, wherein the nonlinear polymer composite material comprises an at least partially cured epoxy resin.

7. The electronic device of claim 5, wherein the first conductive sheet and the second conductive sheet comprise metal foils.

8. The electronic device of claim 5, wherein the electronic device is a cellular phone.

9. The composite diode of claim 1, wherein the nonlinear inorganic particles comprises between 25 and 65 volume percent of the nonlinear composite material.

* * * * *

UNITED STATES PATENT AND TRADEMARK OFFICE
CERTIFICATE OF CORRECTION

| | | |
|---|---|---|
| PATENT NO. | : 9,972,798 B2 | Page 1 of 1 |
| APPLICATION NO. | : 13/883313 | |
| DATED | : May 15, 2018 | |
| INVENTOR(S) | : Dipankar Ghosh | |

It is certified that error appears in the above-identified patent and that said Letters Patent is hereby corrected as shown below:

In the Specification

Column 3
Line 41, Delete "appliation" and insert -- application --, therefor.

Signed and Sealed this
Twenty-ninth Day of January, 2019

Andrei Iancu
*Director of the United States Patent and Trademark Office*